United States Patent
Solak (10) Patent No.: US 8,841,046 B2
(45) Date of Patent: *Sep. 23, 2014

(54) SYSTEM AND A METHOD FOR GENERATING PERIODIC AND/OR QUASI-PERIODIC PATTERN ON A SAMPLE

(75) Inventor: Harun H. Solak, Brugg (CH)

(73) Assignee: Eulitha AG, Villigen (CH)

( * ) Notice: Subject to any disclaimer, the term of this patent is extended or adjusted under 35 U.S.C. 154(b) by 1111 days.

This patent is subject to a terminal disclaimer.

(21) Appl. No.: 11/665,323

(22) PCT Filed: Oct. 13, 2005

(86) PCT No.: PCT/EP2005/010986

§ 371 (c)(1),
(2), (4) Date: Apr. 13, 2007

(87) PCT Pub. No.: WO2006/045439

PCT Pub. Date: May 4, 2006

(65) Prior Publication Data

US 2008/0186579 A1    Aug. 7, 2008

(30) Foreign Application Priority Data

Oct. 22, 2004   (EP) .................................... 04025105
Feb. 16, 2005   (EP) .................................... 05003271

(51) Int. Cl.
| | | |
|---|---|---|
| G03B 27/52 | (2006.01) | |
| G03B 27/68 | (2006.01) | |
| G03F 7/22  | (2006.01) | |
| G03F 7/20  | (2006.01) | |

(52) U.S. Cl.
CPC .......... *G03F 7/70408* (2013.01); *G03F 7/2022* (2013.01); *G03F 7/22* (2013.01); *G03F 7/70325* (2013.01)

USPC .......... 430/2; 430/1; 359/35; 355/77; 355/52; 355/67; 355/50

(58) Field of Classification Search
None
See application file for complete search history.

(56) References Cited

U.S. PATENT DOCUMENTS 3,615,449 A      10/1971   Greenaway
4,239,790 A  *   12/1980   Bosenberg .................... 427/558

(Continued)

FOREIGN PATENT DOCUMENTS

| DE | 19810055 A1 | 9/1999 |
| EP | 0997779 A1  | 5/2000 |

(Continued)

OTHER PUBLICATIONS

Testorf et al. "Planar-integrated Talbot array illuminators", Appl. Opt., vol. 37(23) pp. 5399-5407 (Aug. 1998).*

(Continued)

*Primary Examiner* — Martin Angebranndt
(74) *Attorney, Agent, or Firm* — Pauley Petersen & Erickson (57) ABSTRACT

A system for generating periodic or quasi-periodic patterns on a sample by means of an interference lithography technique includes a photon source, a mask and a sample holder. The mask has a grating for generating a predetermined pattern, wherein the mask is positioned at a first distance from the photon source. The sample holder is disposed at a second distance from the mask on a side facing away from the photon source. The second distance is selected to be where an intensity distribution is substantially stationary and distance-invariant, or the second distance is varied to obtain a desired average intensity distribution on the sample surface.

15 Claims, 5 Drawing Sheets

(56) References Cited

U.S. PATENT DOCUMENTS

| | | | |
|---|---|---|---|
| 4,360,586 A * | 11/1982 | Flanders et al. | 430/321 |
| 5,093,279 A * | 3/1992 | Andreshak et al. | 438/662 |
| 5,124,843 A * | 6/1992 | Leger et al. | 359/565 |
| 5,604,829 A * | 2/1997 | Bruesselbach | 385/37 |
| 5,695,894 A * | 12/1997 | Clube | 430/1 |
| 5,759,744 A | 6/1998 | Brueck et al. | |
| 5,812,629 A * | 9/1998 | Clauser | 378/62 |
| 6,030,266 A * | 2/2000 | Ida et al. | 445/24 |
| 6,233,044 B1 | 5/2001 | Brueck et al. | |
| 6,272,202 B1 | 8/2001 | Chiba et al. | |
| 6,373,553 B1 * | 4/2002 | Singh | 355/55 |
| 8,368,871 B2 * | 2/2013 | Solak et al. | 355/77 |
| 8,524,443 B2 * | 9/2013 | Clube et al. | 430/322 |
| 8,525,973 B2 * | 9/2013 | Solak et al. | 355/77 |
| 2002/0126279 A1 * | 9/2002 | Kung et al. | 356/328 |
| 2003/0147082 A1 | 8/2003 | Goldstein | |
| 2011/0199598 A1 * | 8/2011 | Solak et al. | 355/67 |
| 2011/0310374 A1 * | 12/2011 | Solak et al. | 355/67 |
| 2012/0092634 A1 * | 4/2012 | Solak et al. | 355/67 |
| 2013/0095418 A1 * | 4/2013 | Solak | 430/30 |

FOREIGN PATENT DOCUMENTS

| | | | |
|---|---|---|---|
| FR | 2673009 | * | 8/1992 |
| WO | WO 01/35168 A1 | | 5/2001 |

OTHER PUBLICATIONS

Lohmann et al. "Making an array illuminator based upon the Talbot effect", Appl. Opt., vol. 29(29) pp. 4337-4340 (Oct. 1990).*

Cloetens et al. "Fractional Talbot imaging of phase gratings with hard X-rays", Opt. Lett., , vol. 22(14) pp. 1059-1061 (Jul. 1997).*

Goldberg et al. "Preparations for extreme ultraviolet interferometry of the 0.3 numerical aperture micro exposure tool optic". J. Vac. Sci. Technol. B., vol. 21(6) pp. 2706-2710 (Nov. 12, 2003).*

Zhao et al. "Design of beam scanners based upon Talbot—encoded phase plates" Opt. Mater. vol. 23 p. 313-318 (2003).*

Zhou et al. "simple equations for -phase modulated Talbot illuminator", Micro. Opt. Technol. Lett., vol. 29(1) pp. 49-52 (Apr. 2001).*

Tatah et al. "Photoablation and lens damage from fractional Talbot images o Dammann gratings", Apl. Opt., vol. 36(15) pp. 3577-3580 (May 1997).*

Solak et al., "Sub-50 nm period . . . ", Microelectron. Eng., vol. 67-68 pp. 56-62 (2003).*

Solak et al. "four wave EUV interference lightography", Microelectron. Eng., vol. 61-62 pp. 77-82 (2002).*

Dammann et al. "Restoratino fo faulty images of periodic objects by means of self-imaging" Appl. Opt., vol. 10(6) pp. 1454-1455 (Jun. 1971).*

Machine translation of FR2673009.*

Machine translation of DE 19810055.*

Guerineau et al., "Talbot experiment re-examined: demonstration of an achromatic and continuous self-imaging regime", Optics Communications 180, Jun. 15, 2000, pp. 199-203, XP-4201516.

Dyer et al., "Analysis and application of a 0/1 order Talbot interferometer for 193 nm laser grating formation", Optics Communications 129, Aug. 1, 1996, pp. 98-108, XP-4011370.

European Office Action dated Dec. 3, 2009.

Solak et al., "Fabrication of high resolution zone plates with wideband extreme-ultraviolet hoography", applied Physics Letters, vol. 85, No. 14, Oct. 4, 2004, pp. 2700-2702, XP002334980.

Solak et al., "Multiple-beam interference lithography with electron beam written gratings", Journal of Vacuum Science and Technology B, Microeletronics and Nanometer Structures Processing, Measurement and Phenomena, American Institute of Physics, New York, NY, US, vol. 20, No. 6, Nov. 2002 pp. 2844-2848, XP012009644.

* cited by examiner

Simulation of sparse array of holes obtained with space-invariant lithography

SYSTEM AND A METHOD FOR GENERATING PERIODIC AND/OR QUASI-PERIODIC PATTERN ON A SAMPLE

BACKGROUND OF THE INVENTION

The present invention relates to a system and a method for generating periodic and/or quasi-periodic pattern on a sample using space-invariant interference lithography.

Periodic and/or quasi periodic structures find extensive use in many areas of micro- and nano-technology. Optical gratings, diffraction lenses, patterned magnetic media for data storage, integrated electronic circuits, sensors and display devices are some examples where periodic structures are used. Other application areas using periodic structures include sub-wavelength optical elements, templates for nano-imprint lithography, templates for guided self assembly, templates for crystallization, arrays of nanowires, nanodots, process development for the next generation lithography technologies, in particular Extreme Ultraviolet Lithography (EUVL), catalysis and field emission substrates.

These uses are expected to grow significantly as novel properties of materials with nanometer scale dimensions are exploited in such or other new applications yet not known. Lithographic methods are usually used to fabricate such periodic structures. However, currently available lithographic methods for fabricating patterns with periods less than 100 nm are too costly for widespread exploitation.

Interference lithography (IL) is a known technique for creating periodic structures. Lasers in the visible or ultraviolet regions and synchrotrons in the extreme-ultraviolet (EUV) range are employed as light sources in IL. Periodic, quasi-periodic, curved one and two-dimensional patterns can be produced with IL. Quasi-periodic patterns are described in H. H. Solak, C. David, J. Gobrecht, Fabrication of High-Resolution Zone Plates with Wideband Extreme-Ultraviolet Holography, Appl. Phys. Lett. 85, 2700 (2004). Curved patterns are described in EP 03003 392.

Most IL methods require light sources with a high degree of spatial and/or temporal coherence. Lasers operating in the visible and ultraviolet region often possess one or both of these properties and, therefore, they are used in the vast majority of IL applications. An achromatic IL method with relaxed requirements with respect to these two properties has been described in T. A. Savas, S. N. Shah, M. L. Schattenburg, J. M. Carter, H. I. Smith, *Achromatic Interferometric Lithography for* 100-*nm-Period Gratings and Grids*, J. Vac. Sci. Technol. B 13, 2732 (1995). However, this technique requires very high power from the source as the beam is diffracted by two consecutive gratings with limited efficiency. Moreover, the depth of focus of the obtained pattern is limited by the spatial coherence of the source.

A related technique to IL is Spatial Frequency Multiplication (SFM), where the substrate to be patterned is placed behind a transmission optical grating (mask), as described in U.S. Pat. No. 4,360,586. In a plane parallel to the grating and at certain distances away from the grating, the intensity of light has a periodicity that is a multiple of the periodicity of the mask. In SFM, the sample is placed in a plane where the desired intensity distribution exists and the intensity distribution is recorded in a photo-sensitive film. In this way, new gratings with spatial frequencies that are multiples of the original diffraction grating can be formed. In the described technique, the intensity distribution depends sensitively on the distance from the grating. Therefore, very precise positioning and alignment of the sample to be patterned with respect to the mask (narrow field) is required. This "depth of field" limitation becomes much more restrictive as the period of the mask is reduced. Moreover, this limitation excludes the use of the technique for creating patterns on substrates with topographical features that are larger than the depth of field.

SUMMARY OF THE INVENTION

It is therefore the aim of this invention to provide a system and a method to achieve one-dimensional and two-dimensional, periodic and quasi-periodic patterns with periods in the 10-100 nm range in a cost effective way. Of course, the system has also general applicability to patterns with periods outside this range.

This aim is achieved by the present invention which discloses a system for generating periodic and/or quasi-periodic pattern on a sample by using an interference lithography technique; the system includes:

a) a photon source;
b) a mask having a grating for generating a periodic or quasi-periodic pattern; wherein the mask is disposed at a first distance from the photon source; or after intermediate optical elements such as collimators, collectors, mirrors, lenses, filters and apertures;
c) a sample holder for holding the sample being disposed at a second distance from the mask on a side facing away from the photon source, wherein the second distance is selected to be in a range where an intensity distribution is substantially stationary and distance-invariant or the second distance is varied to obtain a desired average intensity distribution on the sample surface.

With respect to the method, a method for generating periodic and/or quasi-periodic pattern on a sample (S) by using an interference lithography technique is provided, comprising the steps of:

a) providing a photon source;
b) providing a mask having a grating for generating a periodic or quasi-periodic pattern;
c) disposing said mask at a first distance from the photon source or after intermediate optical elements such as collimators, collectors, mirrors, lenses, filters and apertures;
d) providing a sample holder for holding the sample;
e) disposing the sample at a second distance from the mask on a side facing away from the photon source;
f) choosing the second distance to be in a range where the intensity distribution is substantially stationary and distance-invariant or varying the second distance in a continuous or discrete way to obtain a desired average intensity distribution on the surface; and
g) illuminating the sample with the radiation originating from the photon source and passing through the mask.

This system and this method deliver periodic and/or quasi-periodic patterns in a cost-effective way since the source has not to be coherent in time and the sample can be easily positioned within the stationary range.

The light illuminating the mask needs to have some degree of spatial coherence depending on the pattern on the mask and the distance of the sample from the mask. The image on the sample is due to the interference of a number of diffracted beams generated by the periodic patterns on the mask. The desired intensity pattern will require a certain number of these diffraction orders to be mutually coherent with respect to each other. Therefore, the spatial coherence length of the illumination has to be large enough to ensure the mutual-coherence of these diffracted beams. This means that the illuminating beam does not necessarily have to be spatially coherent over the whole mask surface. Therefore sources, which do not provide illumination with a high degree of spatial coherence, such as laser produced plasma or gas discharge sources can be used with the described system and method. On the other hand fully spatially coherent beams, such as the ones available from synchrotron radiation sources, can also be used.

For use with the most currently known applications the system may be operated with the photon source emitting dominantly photons having a wavelength in the range of 1 to 100 nm, preferably 10 to 50 nm which allow generating pattern having a periodicity being significantly smaller.

Cost-effective and available photon source within the current invention may be the use of a plasma source, such as a laser produced plasma source (LPP source), or a gas discharge source.

In order to satisfy the partially very sophisticated demands to the desired pattern, the systems may be operated with masks having a linear grating or a two-dimensional linear grating or a two-dimensional partially non-linear (curved) grating or a two-dimensional periodically circular grating or a two-dimensional variable-period circular grating. Even a combination of different masks might be suitable for designing the desired shape of the pattern. The periodicity of the said patterns can be varied along one or more directions.

The system allows effective protection of the mask from effects such as contamination and deformation and damage due to excessive heating. This is made possible by the large enough room on both sides of the mask for the installation of protective elements such as pellicles and cooling gases. The large distances also protect the mask from accidental contact and resulting damage.

Due to the fact that LPP sources or gas discharge sources can be used with the present invention, the photon source may have a substantially isotropic radiation characteristic, and a plurality of mask/sample holder arrangements are displaced around the photon source. Therefore, the throughput available from a single source can be increased by using a multiplexing scheme or similar multiplication means.

BRIEF DESCRIPTION OF THE SEVERAL VIEWS OF THE DRAWINGS

Examples of the invention are hereinafter described with reference to the drawings. In the drawings.

DETAILED DESCRIPTION OF THE INVENTION

Figure 1:
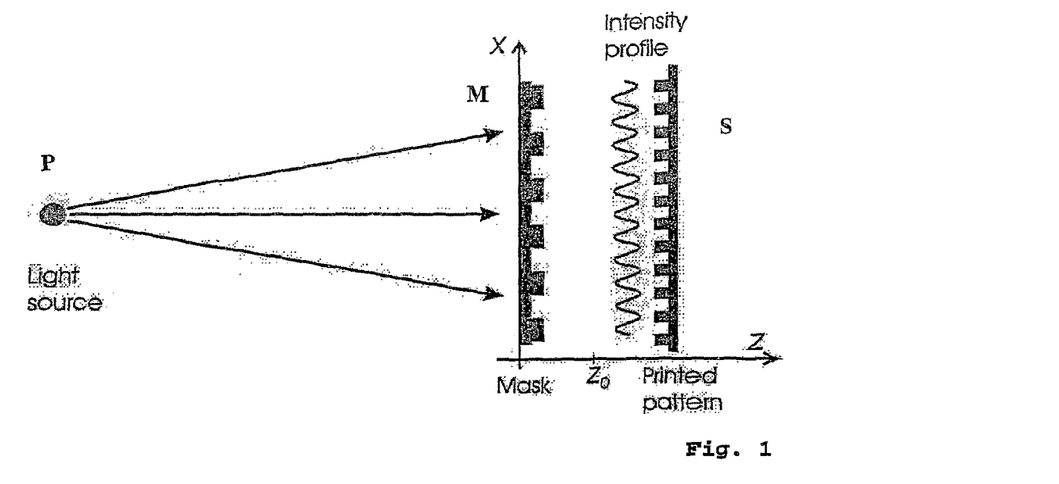
FIG. 1 is a schematic view of a system for generating periodic and/or quasi periodic nano-structures on a sample.

The space-invariant system and method disclosed in this invention use masks M with periodic or quasi-periodic transmission structures. The mask M is illuminated with radiation γ originating from a photon source P that has limited spatial and temporal coherence properties (FIG. 1). The image obtained at distances larger than a certain value $Z_0$ is independent of the distance, in other words, it is space-invariant or with respect to the illustrated z-axis it is z-invariant. The intensity pattern is therefore independent of the distance from the mask beyond a certain $z_0$ value, which depends on the spectral bandwidth of the illuminating beam and the pattern on the mask. The recorded image has periodicity related to the pattern of the mask M. However, it is not necessarily a replica of the mask M or a frequency-multiplied version of it. In this example, the recorded pattern has half the period of the mask M. The image for each mask design can be determined through optical calculations. Furthermore, the same image can be used to record different shapes by applying different exposure doses to the recording medium (photoresist) which is disposed on a sample S.

Figure 2:
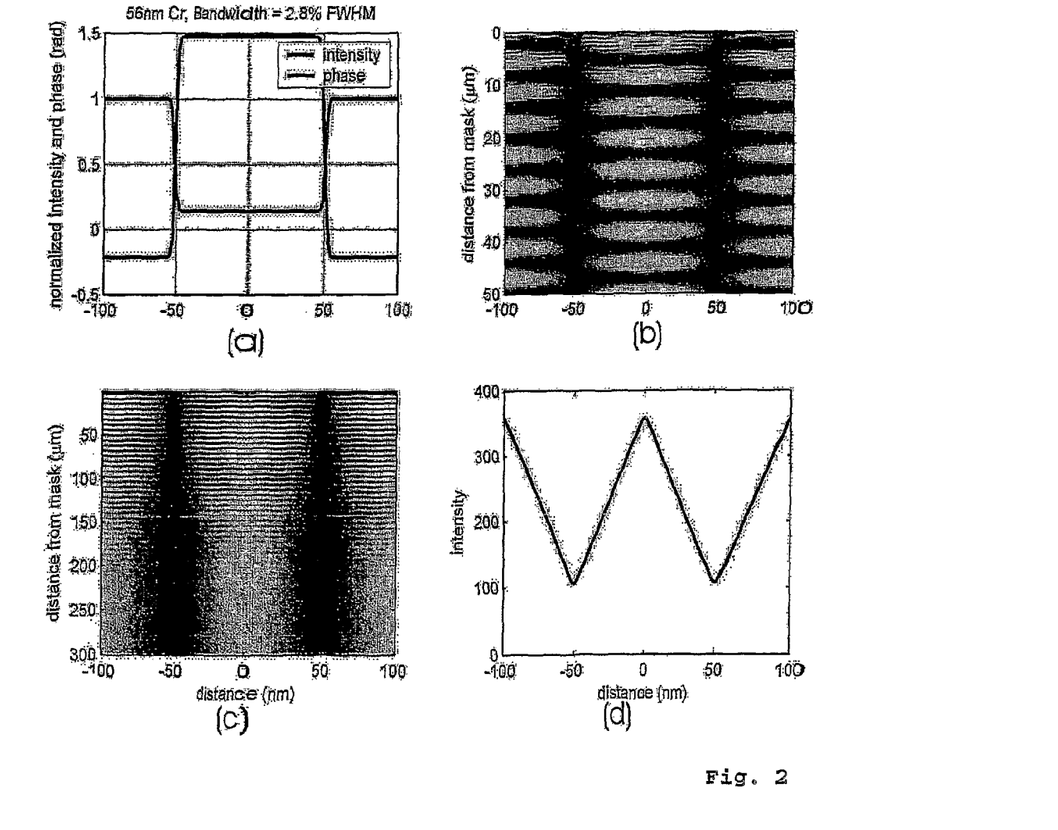
FIG. 2 is the calculation of an image generated by mask having a linear grating.

FIG. 2 shows the image calculated behind a mask having a linear grating. Simulation results show the formation of the z-invariant image. Part (a) indicates the transmission behavior of the mask M. The mask M is formed of 200 nm period Cr bars with approximately 50% duty cycle. The Cr thickness is 56 nm and the illuminating radiation has a central wavelength of 13.4 nm and 2.8% bandwidth (FWHM). In all parts (a) to (d) of the figure the horizontal axis corresponds to one period of the mask M, which is 200 nm. As shown in part (b) the intensity distribution immediately behind the mask M showing the periodic dependence of the pattern on z. Even in that limited range some of the high frequency variations in the intensity profile die down after a short distance from the mask. Part (c) illustrates the intensity distribution over a larger z range. The periodic variation of the intensity profile vanishes for distances greater than about 200 μm. High intensity regions are indicated by brighter grey tones. Part (d) shows the image profile obtained after the periodic oscillations die down. This image has half the period of the original Cr pattern in the mask M. The modulation in this image is sufficient to record sharp line/space features in a photoresist sample S.

FIG. 2 illustrates that the image has a strong periodic dependence on the distance from the mask plane as seen in FIGS. 2b and 2c. However, this dependence dies down after about 200 μm away from the mask M. From that point on, the intensity profile is constant as shown in FIG. 2d. The modulation of intensity and the shape of the final profile depend on the mask pattern. In particular, the duty cycle of the periodic pattern in the mask M and the absorbing and phase shifting properties of the material used to make the grating bars affect the final image profile.

Figure 3:
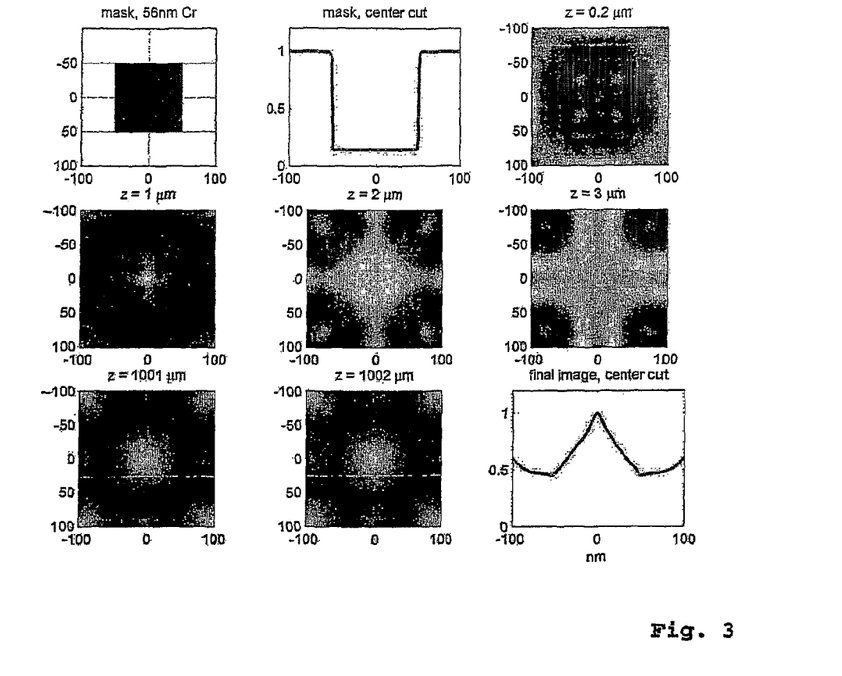
FIG. 3 is the calculation of the generation of a z-invariant image behind a mask having a first two-dimensional grating.
Figure 4:
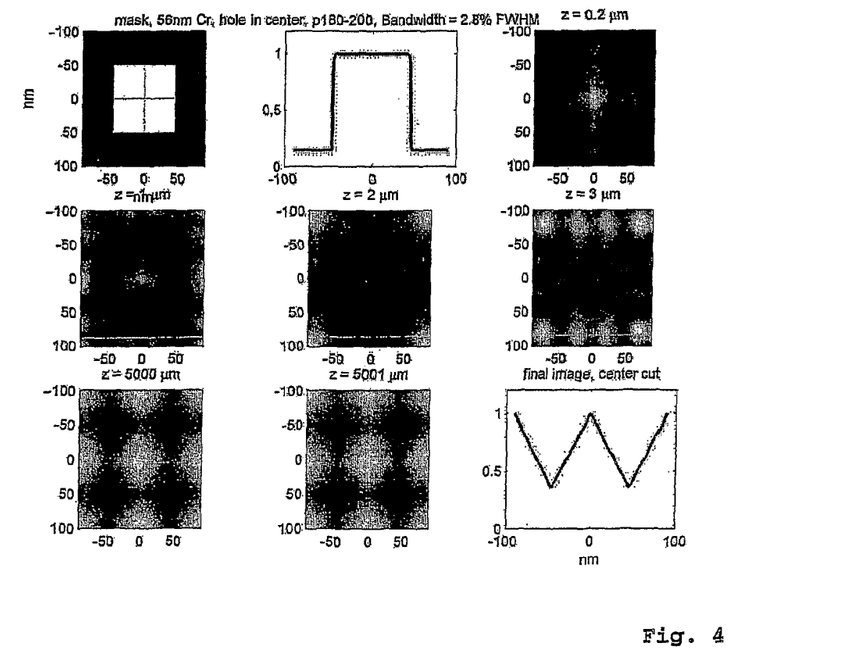
FIG. 4 is the calculation of the generation of a z-invariant image behind a mask having a second two-dimensional grating.

Two-dimensional z-invariant periodic patterns can be obtained and recorded using the same principle. Two examples are shown in FIGS. 3 and 4. The strikingly different images in these two figures are obtained by a slight change in the mask layout. In both cases, the mask consists of holes in a Cr film on a rectangular grid. In the first case according to FIG. 3 the periods of the grid in the horizontal and vertical directions are identical. This leads to the coherent summation of diffracted orders in these two directions (as well as mixed orders in other directions). In the second case according to FIG. 4, the two periods (horizontal and vertical) are slightly different, which qualitatively changes the image, as various diffracted orders can no longer be added coherently. This points to an important tool that can be used to control the images in the described achromatic interference technique. Many different two-dimensional images can be obtained such as hexagonal arrays, quasi-periodic and curved patterns with the described technique. It is possible to vary the periodicity of a pattern along one or more directions. For example variable period linear gratings, Fresnel Zone Plates or variable period two-dimensional dot arrays can be obtained. In another variation the variable periodicity can be combined with curved structures to obtain arrays of dots on concentric circular tracks.

In detail now, FIG. 3 illustrates in nine parts a) to i) the simulation results showing the formation of a two-dimensional z-invariant image. Part (a) is the transmission of the mask. The mask is formed of $100 \times 100 \text{ nm}^2$ size holes on a 200 nm period square grid. One period of the square grid is shown. The Cr thickness is 56 nm. Part (b) is the cross-section of the mask transmission along a line cutting through the center of the image in part (a) At very close distances behind the mask the image is tremendously depending form this distance as it can be seen from parts (c), (d), (e) and (f) which are calculated for a distance of 0.2 μm, 1 μm, 2 μm and 3 μm, respectively. The parts (g) and (h) are calculated for a distance of 1000 μm and 1001 μm, respectively. and show the z-invariant behavior at that distance where the image is z-invariant or in other wordsc stationary. The image consists of an array of intensity peaks on a 45° tilted square grid. The period of the image is equal to the mask period divided by $\sqrt{2}$, i.e. 141 nm.

FIG. 4 in detail shows the simulation results for a mask pattern that is slightly different than the one in FIG. 3. In this case the periods of the mask pattern in the horizontal and vertical directions are not the same; they are 180 nm and 200 nm respectively. The image is dramatically different, since the diffracted orders in the horizontal and vertical directions do not interfere coherently any more. The image consists of a square array of intensity peaks with half of the mask period. This configuration is especially useful as it produces a higher resolution pattern. Again, the z-invariance of the image is not given for the short distance as indicated in parts (c), (d), (e) and (f) which are calculated for a distance of 0.2 μm, 1 μm, 2 μm and 3 μm, respectively. The parts (g) and (h) are calculated for a distance of 5000 μm and 5001 μm, respectively. and show the z-invariant behavior at that distance where the image is z-invariant or in other words stationary.

Figure 5:
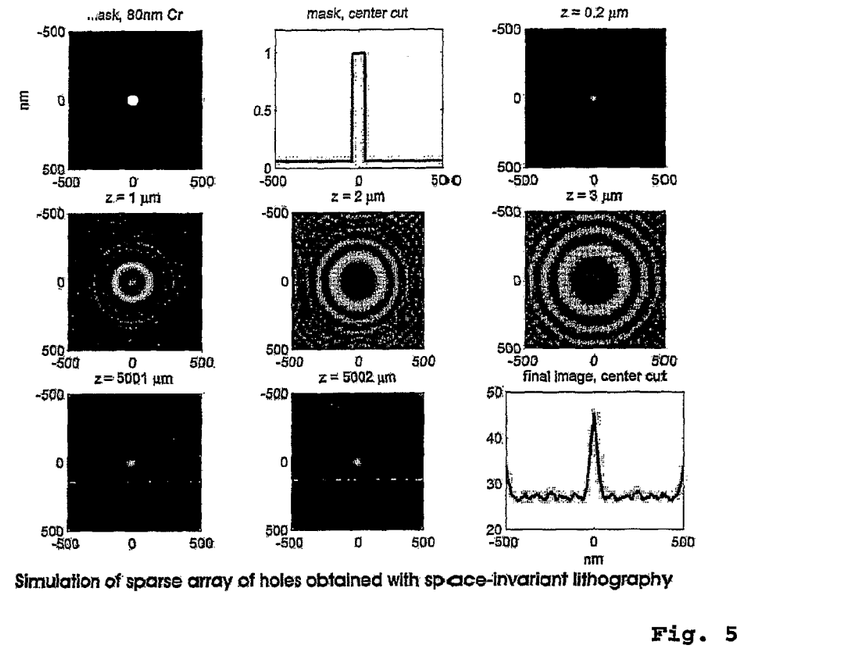
FIG. 5 is the calculation of the generation of a z-invariant image behind a mask having a third two-dimensional grating.
Figure 6:
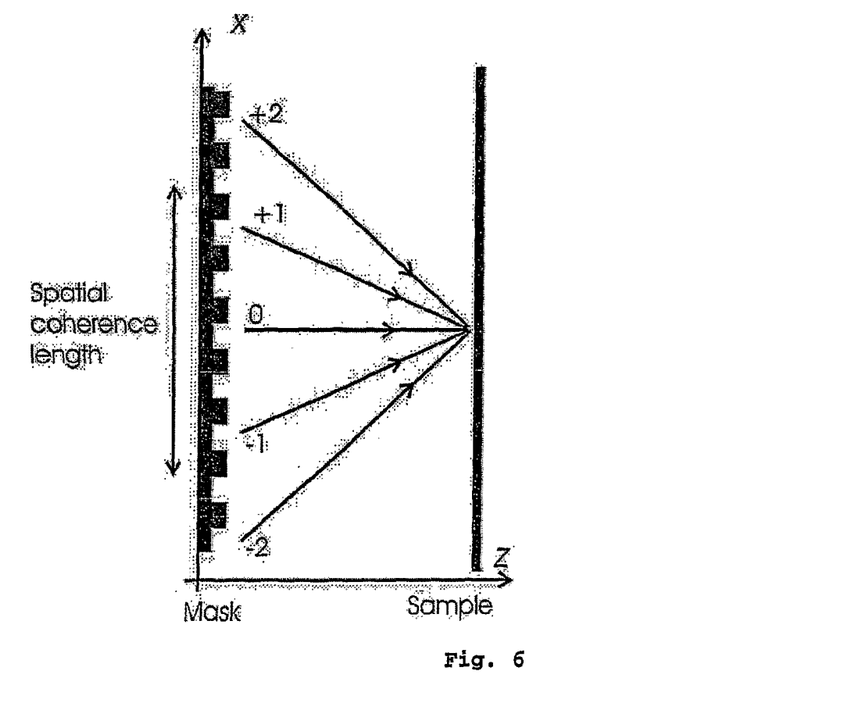
FIG. 6 is the schematic explanation of the spatial coherence requirement of the described method.

FIG. 5 in detail shows the simulation results for a mask pattern that is different than the ones in FIG. 3 and FIG. 4. In this case the size of the feature in the mask is much smaller than the period. The mask consists of 80 nm diameter holes on a 1 micrometer period square grid. The stationary image at large z consists of sharp intensity peaks on a 45° tilted square grid with a periodicity of 707 nm. In addition the holes are connected with bright lines. This image can be used to print sparse arrays of nanometer size structures with a period that is much larger than the structure size. Alternatively it can be used to print a mesh like structure with horizontal, vertical and diagonal lines. Again, the z-invariance of the image is not given for the short distance as indicated in parts (c), (d), (e) and (f) which are calculated for a distance of 0.2 μm, 1 μm, 2 μm and 3 μm, respectively. The parts (g) and (h) are calculated for a distance of 5001 μm and 5002 μm, respectively. and show the z-invariant behavior at that distance where the image is z-invariant or in other words stationary.

Figure 7:
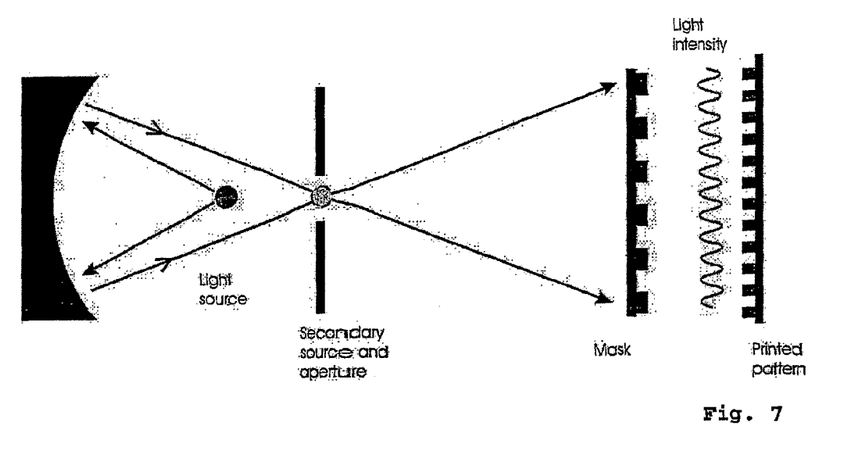
FIG. 7 is a schematic layout of a possible lithography system using a light source such as a laser plasma or gas discharge source working in the EUV range.

The limited spatial and temporal coherence requirements of the technique make it possible to use commercial stand-alone sources such as plasma and gas-discharge sources in the EUV range in association with the described technique. These sources are being developed to be used in future EUV lithography systems and they are commercially available. FIG. 7 schematically shows a possible optical layout of a lithography system using such a source. The light from the source is collected by reflective optics (grazing incidence or multilayer coated for near normal incidence) and focused to form an image. Apertures can be introduced in or near this image plane to further define the source size according to the requirements of the lithography tool. The divergence of the beam can also be adjusted in this way. Other elements can be included in the system to prevent contamination from the source from reaching the mask. One or more filters can be placed in the beam at various positions to eliminate undesired parts of the emission spectrum from the source.

Figure 8:
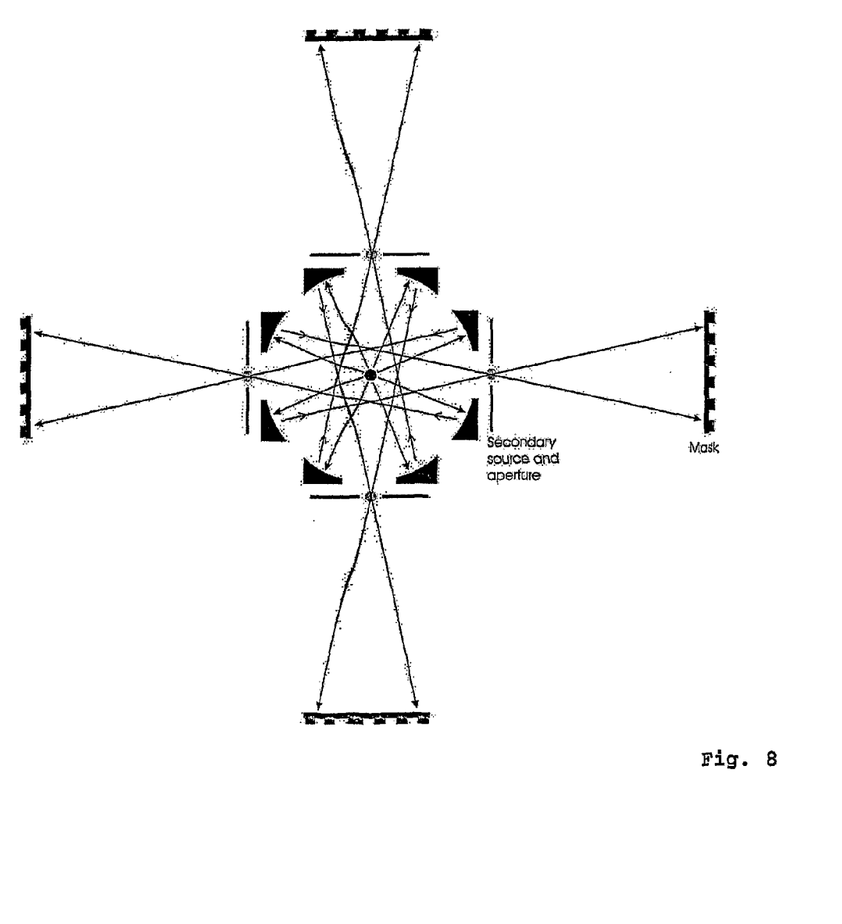
FIG. 8 is a schematic layout of a possible system where four exposure systems are put together around a single source.

The EUV sources have sufficient power and spatial coherence to enable high volume production through the described technique. Very efficient use of the light from the source is used in this system since the number of optical elements is limited and all the diffracted orders from the mask are used in exposing the resist. This last point is in contrast to other interference lithography systems that make use of only one diffracted order from such a periodically patterned mask. The throughput available from a single source can be further increased by using a multiplexing scheme like the one shown in FIG. 8. It is illustrated that multiple samples S can be exposed simultaneously using a single source. The schema shows a possible layout where four exposure systems are put together around a single source.

The technique introduces a new way of making nanometer scale periodic patterns over large areas with high throughput. Currently, electron-beam lithography can be used to fabricate such patterns. But being a serial process with low throughput, the cost is prohibitively high for commercial exploitation. Other important drawbacks of e-beam lithography include the necessity to use conducting substrates to avoid charging, and the proximity effect due to the long range of secondary electrons created in the sample.

Alternatively, mechanical techniques, such as nanoimprint lithography can be used to fabricate such patterns. This technique requires templates that have the same resolution as the end product. The templates are typically made by e-beam lithography. The lifetime of these templates is limited due to the physical contact made with each substrate. Therefore the nanoimprint method relies on e-beam lithography for supplying masters in sufficient quantities. Moreover the contact with the substrate may lead to additional problems in the process. Some sensitive substrates may be damaged by the applied pressure in the imprinting step. In addition, topography of the substrates has to be carefully controlled to allow a uniform and close contact with the template. This can exclude samples with inherent topographical features.

The technique described in this invention overcomes all of the difficulties mentioned above for competing techniques. Being a parallel process and making efficient use of the available light, the throughput is high. By using light in the EUV region (e.g. 13 nm wavelength) the resolution limit for the period is about 7 nm (half of the wavelength). The proximity effect that severely affects e-beam lithography is practically nonexistent due to the short range of secondary electrons created by EUV light. The charging of samples has no effect on the resolution since photons are used in the exposure. There is no physical contact with the sample to cause damage to it.

The obtained patterns in general have higher resolution than the mask. This relaxes the requirements on the fabrication process for the mask. A particularly appealing possibility is to use laser interference lithography (LIL) to make large area masks that can then be demagnified using the described process using EUV light. The LIL created mask can be used either directly or they can be used to make higher resolution masks.

In the examples shown above the image is space invariant after a distance $z_0$ from the mask, which depends on the spectral bandwidth of the illuminating beam and the pattern on the mask. The $z_0$ distance is inversely related to the bandwidth, in other words $z_0$ distance decreases as the bandwidth increases. Therefore, the positioning of the sample in the z-direction is not critical. The distance between the mask and the sample can be in the order of hundreds of microns or millimeters. Therefore the technique is not a proximity printing technique. This large working distance eliminates the risk of physical damage to the mask from coming into physical contact with the substrate or with possible particles that may have landed on the sample. The large depth of field also makes it possible to record patterns over substrates that possess substantial topography. This large distance may also help with the introduction of gases between the mask and the sample if this is desired for reasons such as the temperature stabilization of the mask.

Figure 9:
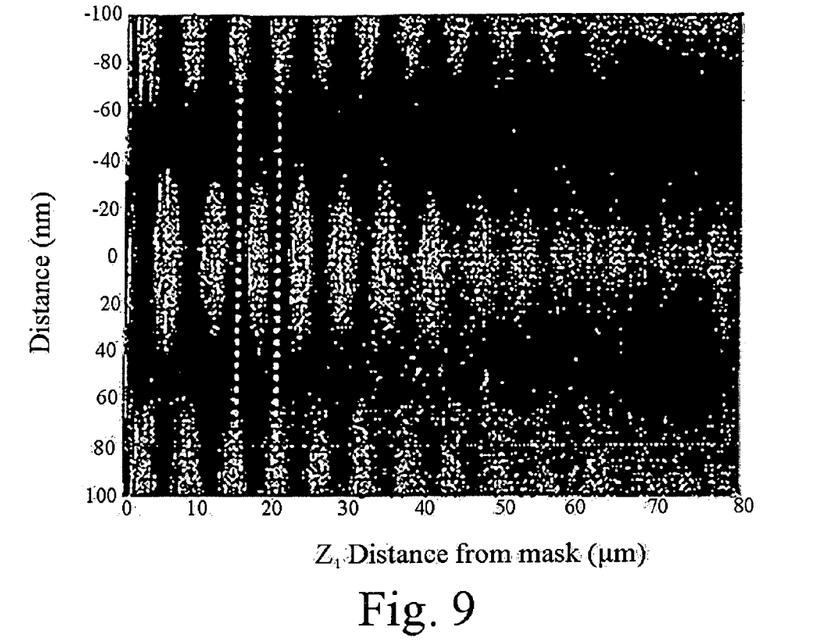
FIG. 9 is a calculation showing the intensity distribution behind a linear grating.
Figure 10:
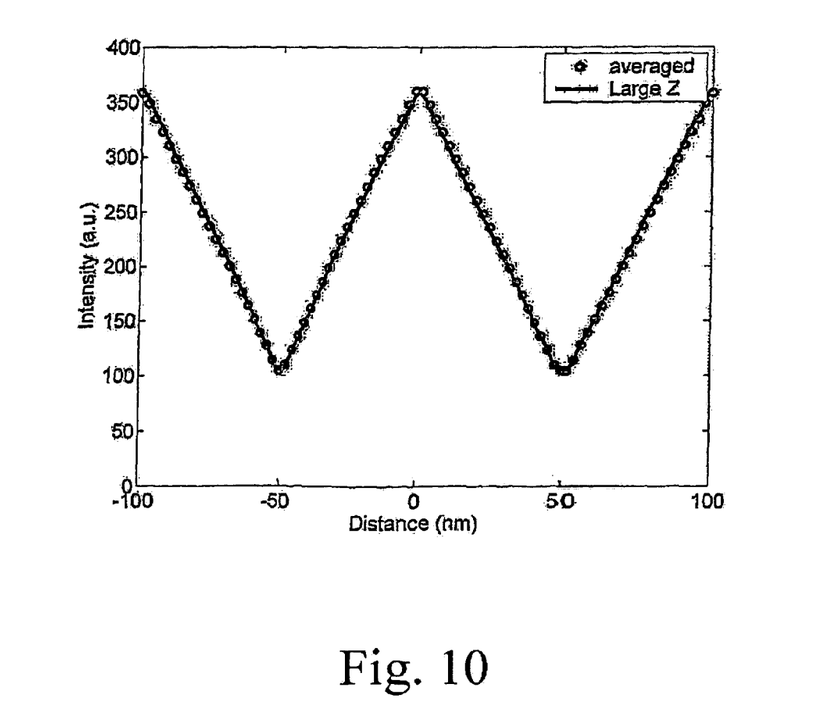
FIG. 10 is a plot of the intensity distribution showing both the average intensity distribution within the dashed region in FIG. 9 and the intensity distribution at large z-distances.

As disclosed above, the use of a wideband beam eliminates the z-dependence after a certain distance $z_0$ from the mask. However in certain cases it may be desirable to use a shorter distance between the sample and the mask than $z_0$. In this embodiment, it is explicitly described how a way of recording the pattern with a number of advantages can be achieved. In FIG. 9, the calculated intensity distribution behind a periodic mask is shown as an example. The simulation result shows the intensity distribution behind a linear grating. The mask has a 200 nm period, one-to-one line/space pattern in a 56 nm thick Cr film. The illumination had a central wavelength of 13.4 nm and 7% bandwidth. The intensity distribution was averaged over the z range between the dashed lines to obtain the "averaged" plot which is shown in FIG. 10. The continuous line shows the stationary distribution obtained for large z (z>150 µm in this case). The open circles show the average of the intensity distribution obtained between the dashed lines in FIG. 9. The two plots are essentially identical demonstrating the possibility of recording the "stationary" distribution at much smaller z by averaging over a certain z-range.

The periodic dependence of the intensity on the distance from the mask dies down as this distance (z) increases. At large enough distances (not shown in the figure) this dependence is completely eliminated for all practical purposes. It can be shown that the stationary intensity distribution obtained at large distances is equivalent to the "average" intensity distribution at all distances, including the region where the intensity oscillates strongly as a function of z. This average has to be calculated over at least one periodic oscillation of the intensity distribution. In FIG. 10, the average intensity distribution is shown, which was computed between the dashed white lines in FIG. 1. The averaging was performed between positions z=14.4 µm and z=20.0 µm. In FIG. 10, also a plot of the stationary intensity distribution obtained at large distances is shown. The average intensity distribution at small z (between positions z=14.4 µm and z=20.0 µm) and the stationary one at large z are essentially identical.

This observation leads to the conclusion that this technique can be used to record patterns at distances much smaller than that is required to obtain the "stationary" image. In practice, the "averaging" operation can be accomplished by recording exposures at multiple z positions or by varying the sample-mask distance continuously during the exposure. This embodiment of the present invention relaxes the requirement on the spectral bandwidth of the beam. In other words, patterns can be recorded using sources with high mono-chromaticity. For example, lasers with high temporal coherence (narrow bandwidth) can be used. When such highly monochromatic sources are used the $z_0$ distance for achieving a stationary distribution can be impractically large.

When the sample to mask distance is small the spatial coherence requirement is reduced. This is because the interfering beams originate from a smaller area on the mask when the distance to the sample is small. Additionally, the distance between the sample and the mask does not need to be adjusted or known precisely. Moreover, this distance does not have to be the same for all points on the mask. However, the multiple exposures or the scanning of the gap has to be done over a z-range of an integer multiple of periods. The precision required for the scan range should be calculated depending on the requirements of the experiment. This is an easier condition to satisfy since relative displacement of the sample (or the mask) by a precise distance is much easier than setting the absolute gap between the sample and the mask with the same precision.

The small distance between the sample and the mask provide additional advantages. In general, the smaller gap would confine the effects of defects and irregularities on the mask to a smaller area on the patterned sample. The edges of the grating area can be considered as a particular form of irregularity. Normally, there is a ringing effect (oscillation of intensity) near the edges of the patterned area because of Fresnel diffraction. Moreover, some area near the edges is lost because some diffraction orders travel towards the inside of the grating area away from the edges. The width of that lost region is proportional to the distance between the sample and the mask. Both edge effects can be reduced by working with a smaller gap. These can be important advantages especially for gratings that need to have a small area such as Fresnel zone plates.

The invention claimed is:

1. A method for printing at least one of a first periodic and a first quasi-periodic pattern by using an interference lithography technique, comprising:
   a) providing a photon source;
   b) providing a mask having at least one of a second periodic and second quasi-periodic patterns for printing at least one of said first patterns;
   c) illuminating said mask with a beam of photons from the photon source, the photons having a central wavelength, and generating a transmitted intensity distribution that oscillates with a period in a direction away from the mask;
   d) providing a sample having a surface with a recording medium disposed thereon;
   e) providing a sample holder for holding the sample;
   f) positioning the sample at a second distance from the mask and in the oscillating transmitted intensity distribution, wherein the second distance is in a continuous range; and
   g) varying the second distance in a continuous or discrete way over a total distance of at least one oscillation period of the intensity distribution during exposure of the recording medium to the intensity distribution, whereby the recording layer integrates the intensity distribution illuminating the recording layer as the second distance varies and printing a desired average intensity distribution into the recording medium on the sample surface that corresponds to at least one of said first patterns.

2. The method according to claim 1, additionally comprising at least one of collimating, condensing, shaping, and filtering light emitted from the photon source before the light illuminates the mask.

3. The method according to claim 1, wherein at least one of said second patterns in the mask is predetermined using computer simulation.

4. The method according to claim 1, wherein the mask and the sample are scanned together to form a desired dose distribution on the sample.

5. The method according to claim 1, wherein the illuminating beam is scanned across the mask and the sample.

6. The method according to claim 1, wherein a gas is introduced on at least one side of the mask to perform at least one of removal of heat and prevention of contamination.

7. The method according to claim 1, wherein the absolute value of the second distance is not adjusted or known with a precision better than one periodic oscillation of the intensity distribution.

8. The method according to claim 1, wherein the absolute value of said second distance varies over the area of the mask by up to or greater than one periodic oscillation of the intensity distribution.

9. The method according to claim 1, wherein the oscillation period of the intensity distribution is determined using computer simulation.

10. The method according to claim 1, wherein at least one of said first patterns is not a frequency-multiplied version of at least one of said second patterns.

11. The method according to claim 1, wherein the recording medium is photoresist.

12. The method according to claim 1, wherein the mask is illuminated by photons in a direction substantially orthogonal to the mask.

13. A method according to claim 1, wherein one of the first patterns has a first period, one of the second patterns is a linear grating with a second period, and the first period is half of the second period.

14. A method according to claim 1, wherein one of the first patterns has a first period, one of the second patterns has a two-dimensional square grid with a second period, and the first period is equal to the second period divided by $\sqrt{2}$.

15. A method for printing at least one of a first periodic and a first quasi-periodic pattern by using an interference lithography technique, comprising:
   a) providing a photon source;
   b) providing a mask having at least one of a second periodic or second quasi-periodic pattern for printing at least one of said first patterns;
   c) providing a sample having a surface with a recording medium disposed thereon;
   d) providing a sample holder for holding the sample;
   e) illuminating the mask with a beam of photons from the photon source, the beam of photons having a central wavelength and generating a transmitted intensity distribution that oscillates with a period in a direction away from the mask;
   f) recording photon exposure during the illuminating with the recording medium at a second distance from the mask in a continuous range where in the second distance the transmitted intensity distribution oscillates in the direction away from the mask;
   g) varying the second distance in a continuous or discrete way over a total distance of at least one oscillation period of the transmitted intensity distribution during the photon exposure; and
   h) printing an average intensity distribution of the plurality of distances during the photon exposure into the recording medium on the sample surface that corresponds to at least one of said first patterns.

\* \* \* \* \*